US007271085B2

(12) United States Patent
Ahn

(10) Patent No.: US 7,271,085 B2
(45) Date of Patent: Sep. 18, 2007

(54) METHOD OF FABRICATING A SEMICONDUCTOR INTERCONNECT STRUCTURE

(75) Inventor: Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 88 days.

(21) Appl. No.: 10/641,540

(22) Filed: Aug. 15, 2003

(65) Prior Publication Data

US 2004/0038522 A1    Feb. 26, 2004

Related U.S. Application Data

(60) Continuation of application No. 09/325,329, filed on Jun. 3, 1999, now Pat. No. 6,633,074, which is a division of application No. 08/874,389, filed on Jun. 13, 1997, now Pat. No. 6,037,248.

(51) Int. Cl.
H01L 21/4763    (2006.01)
(52) U.S. Cl. ........................ 438/619; 257/758
(58) Field of Classification Search ............... 438/319, 438/411, 421, 618, 619, 622, 637, 672, 675, 438/687; 257/522, 758, 759, 762, 765
See application file for complete search history.

(56) References Cited

U.S. PATENT DOCUMENTS

| 4,753,896 A | * | 6/1988 | Matloubian | ............... 438/149 |
| 5,000,818 A | | 3/1991 | Thomas et al. | |
| 5,034,799 A | * | 7/1991 | Tomita et al. | ............... 257/758 |
| 5,071,518 A | | 12/1991 | Pan | |
| 5,272,111 A | | 12/1993 | Kosaki | |
| 5,354,712 A | | 10/1994 | Ho et al. | |
| 5,391,921 A | | 2/1995 | Kudoh et al. | |

(Continued)

FOREIGN PATENT DOCUMENTS

EP    0 393 635 A2    12/1990

(Continued)

OTHER PUBLICATIONS

Carley, L., et al., "Fabrication and Performance of Mesa Interconnect," Proceedings of the 1996 International Symposium on Low Power Electronics and Design, Aug. 1996, pp. 133-137.

(Continued)

*Primary Examiner*—David Vu
(74) *Attorney, Agent, or Firm*—Fletcher Yoder

(57) ABSTRACT

A method of fabricating a semiconductor interconnect structure is disclosed. The method includes forming a first metal plug in a first opening defined by a first layer of photoresist, forming a first metal layer in a second opening defined by a second layer of photoresist, forming a second metal plug in a third opening defined by a third layer of photoresist, forming a second metal layer on the third layer of photoresist, and removing the first, second and third layers of photoresist. The first metal plug is also formed in contact with a substrate assembly. The first metal layer is also formed in contact with the first metal plug. The second metal plug is also formed in contact with the first metal layer. The second metal layer is also formed in contact with the second metal plug.

38 Claims, 7 Drawing Sheets

U.S. PATENT DOCUMENTS

| | | |
|---|---|---|
| 5,521,121 A | 5/1996 | Tsai et al. |
| 5,556,812 A | 9/1996 | Leuschner et al. |
| 5,639,686 A | 6/1997 | Hirano et al. |
| 5,686,760 A | 11/1997 | Miyakawa |
| 5,783,864 A | 7/1998 | Dawson et al. |
| 5,798,559 A | 8/1998 | Bothra et al. |
| 5,824,599 A | 10/1998 | Schacham-Diamand et al. |
| 5,834,845 A | 11/1998 | Stolmeijer |
| 5,843,837 A | 12/1998 | Baek et al. |
| 5,935,868 A * | 8/1999 | Fang et al. ............... 438/692 |
| 5,950,102 A | 9/1999 | Lee |
| 5,953,626 A | 9/1999 | Hause et al. |
| 5,981,374 A * | 11/1999 | Dalal et al. ............... 438/624 |
| 6,037,248 A | 3/2000 | Ahn |
| 6,069,068 A | 5/2000 | Rathore et al. |
| 6,130,161 A * | 10/2000 | Ashley et al. ............... 438/687 |

FOREIGN PATENT DOCUMENTS

EP    0 475 646 A2    3/1992

OTHER PUBLICATIONS

Togo, M. et al., "A Gate-side Air-gap Structure (GAS) to Reduce the Parasitic Capacitance in MOSFETs," 1996 Symposium on VLSI Technology Digest of Technical Papers, pp. 38-39.

Anand, M. et al., "NURA: A Feasible, Gas-Dielectric Interconnect Process," 1996 Symposium on VLSI Technology Digets on Technical Papers, pp. 82-83.

Parameswaran, M. et al., "A New Approach for the Fabrication of Micromechanical Structures," Sensors and Activators, vol. 19, pp. 289-307 (1989).

* cited by examiner

METHOD OF FABRICATING A SEMICONDUCTOR INTERCONNECT STRUCTURE

CROSS-REFERENCE TO RELATED APPLICATIONS

This application is a continuation of U.S. patent application Ser. No. 09/325,329, filed Jun. 3, 1999 now U.S. Pat. No. 6,633,074, which is a divisional of U.S. patent application Ser. No. 08/874,389, filed Jun. 13, 1997, now U.S. Pat. No. 6,037,248.

BACKGROUND OF THE INVENTION

The present invention is directed generally to semiconductor interconnect layers exhibiting a low RC time delay, and, more particularly, to semiconductor interconnect layers made of a material having a low resistivity that is surrounded by a material with a low dielectric constant.

It is common in the semiconductor art to use layers of metal, polysilicon, or another conductor to conduct current between various semiconductor devices that form integrated circuits. The layers of conductor are connected to each other by means of vias and are connected to other materials by means of contacts.

When a metal is used to form the interconnect layers of conductors, the metal is usually deposited on the semiconductor by sputtering, chemical vapor deposition (CVD), or evaporation. The CVD process forms a non-volatile solid film on a substrate by the reaction of vapor phase chemicals that contain the desired constituents. The metals that are commonly used for the interconnect layers are aluminum and its alloys. The metal layers are typically deposited over dielectric materials, such as silicon dioxide. Thus, parallel plate capacitive effects are observed due to this structure. The capacitance for a layer can be represented as:

$$C = \frac{\epsilon_0 \epsilon_{ins} A}{D} \quad (1)$$

where:
  D=SiO$_2$ thickness
  A=Area of plates
  $\epsilon_0$=Permittivity of free space
  $\epsilon_{ins}$=Permittivity of SiO$_2$ This capacitance increases as the density of the integrated circuits increases. Also, the line resistance due to the metal layers increases as the density of the integrated circuits increases. The resistance of a sheet of conducting material is given as:

$$R_s = \frac{pl}{tW} \quad (2)$$

where:
  p=Material resistivity
  t=Material thickness
  L=Material length
  W=Material width Thus, the time delay caused by the product of the line resistance and the capacitance becomes critical.

FIG. 1 shows a cross sectional view of a typical semiconductor device (a transistor) in simplified form. A Local Oxidation of Silicon (LOCOS) process is performed on a substrate layer 10 to create a gate oxide region 12 separated by field oxide regions 13. A polysilicon layer 14 is then deposited; typically to form the gate structure of the transistor, and a spacer 15 is fabricated around the remainder of layer 14. Impurities are diffused into the substrate layer 10 to form diffusion areas 16, which typically form the drain and source structures of the transistor. A layer of silicon dioxide 18 is grown and the contact and via areas are removed by etching. A silicide or metal layer 20 is formed on the diffusion areas 16, which typically provide areas for interconnection with the drain and source structures of the transistor. A first layer of metal 22, typically aluminum or an alloy of aluminum, is then deposited and areas are removed to form the required interconnection pattern. Alternatively, metal contact plugs may be formed in the contact and via area formed in layer 18. Subsequent layers of silicon dioxide and metal may be grown and deposited, respectively, depending on the interconnection pattern required for the integrated circuit.

An attempt to reduce the capacitance associated with interconnect layers deposited on dielectric materials is shown in Togo, et al., "A Gate-side Air-gap Structure (GAS) to Reduce the Parasitic Capacitance in MOSFETs", 1996 Symposium on VLSI Technology Digest of Technical Papers, pp. 38-39. Togo, et al. outlines a transistor structure in which the sidewalls of the gate structure are surrounded by an air gap. A silicon nitride sidewall is first fabricated that surrounds the gate. A layer of silicon dioxide is formed around the silicon nitride sidewall. The silicon nitride sidewall is removed by a wet etching process to form an air gap between the gate structure and the silicon dioxide.

Another attempt to reduce the capacitance associated with interconnect layers deposited on silicon is shown in Anand, et al., "NURA: A Feasible, Gas-Dielectric Interconnect Process", 1996 Symposium on VLSI Technology Digest of Technical Papers, pp. 82-83. Anand, et al. outlines a metal interconnect structure in which layers of a gas are formed between thin layers of silicon dioxide. The thin layers of silicon dioxide have metal interconnect layers deposited on them. The process begins when layers of carbon are formed on a surface and trenches are formed for future interconnections. An interconnect metal layer is formed in the carbon trenches and a thin layer of silicon dioxide is sputter-deposited. Oxygen is then furnace ashed into the carbon layer through diffusion and the oxygen reacts with the carbon to form carbon dioxide. This process is repeated to form the interconnect structure of the device under fabrication.

Although Togo, et al. claims to reduce the capacitance associated with the interconnect layers by reducing the dielectric constant of the materials between the interconnect layers, Togo, et al. only provides a low dielectric material (air) around the gate contact of a transistor. Also, Togo, et al. does not disclose an interconnect structure that has reduced resistivity.

Likewise, even though Anand, et al. claims to reduce the capacitance associated with the interconnect layers by reducing the dielectric constant of the materials between the interconnect layers, Anand, et al. adds complexity to the semiconductor fabrication process because carbon is used in the process, which is not typically used in the manufacture of semiconductor devices. The method of Anand, et al. does not disclose an interconnect structure that has reduced resistivity.

Thus, the need exists for a semiconductor interconnect structure with reduced capacitance and reduced resistivity, thereby decreasing the RC time delay associated with the interconnect layers. The need also exists for a method of fabricating such a structure using standard fabrication steps in conjunction with commercially available processing equipment.

SUMMARY OF THE INVENTION

The present invention is directed generally to a semiconductor interconnect structure and a method of making the same. Layers of photoresist are formed between conductive layers and the photoresist is removed by, for example, ashing in oxygen plasma. When the photoresist layers are removed, the conductive layers are surrounded by air, which has a dielectric constant of 1. The conductive layers are preferably comprised of copper.

The present invention represents significant advantages over the prior art. Because the air spaces between the conductive interconnect layers are formed by removing layers of photoresist, no extra material need be introduced into the semiconductor manufacturing process. Also, because the conductive interconnect layers are surrounded by air, the plate capacitance of the interconnect structure is reduced. Furthermore, because a low resistive material such as copper is used for the conductive interconnect layers, the resistance associated with the interconnect structure is reduced. Using copper as the material for the interconnect layers has the further advantage that the layers may be electroplated or electroless plated at low temperatures. Those advantages and benefits of the present invention, and others, will become apparent from the Detailed Description of the Invention hereinbelow.

BRIEF DESCRIPTION OF THE DRAWINGS

For the present invention to be clearly understood and readily practiced, the present invention will be described in conjunction with the following figures wherein.

DETAILED DESCRIPTION OF THE INVENTION

It is to be understood that the figures have been simplified to illustrate only those aspects of semiconductor topography which are relevant, and some of the dimensions have been exaggerated to convey a clear understanding of the present invention, while eliminating, for the purposes of clarity, some elements normally found on a semiconductor. Those of ordinary skill in the art will recognize that other elements and process steps are required to produce an operational semiconductor. However, because such elements and process steps are well known in the art, and because they do not further aid in the understanding of the present invention, a discussion of such elements is not provided herein.

Figure 1:
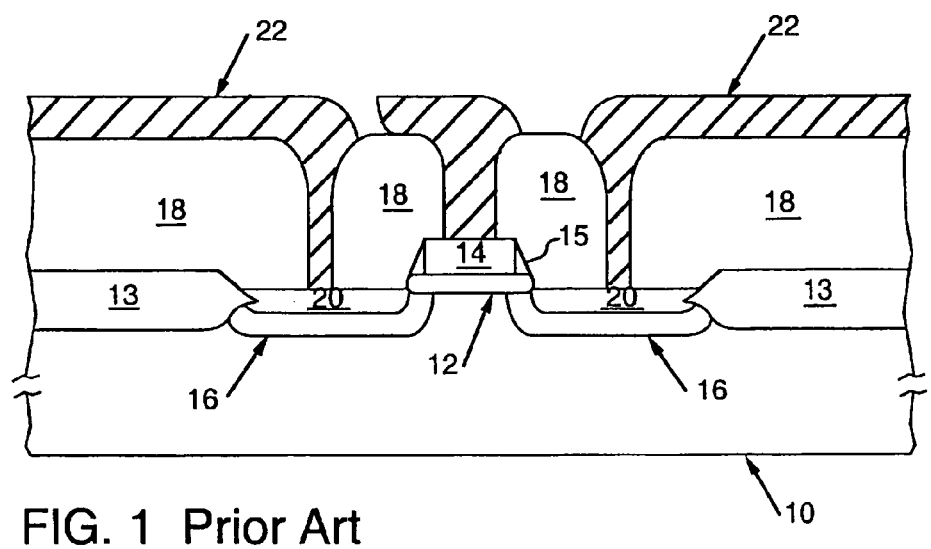
FIG. 1 is a cross-sectional view of a typical prior art semiconductor device.
Figure 2:
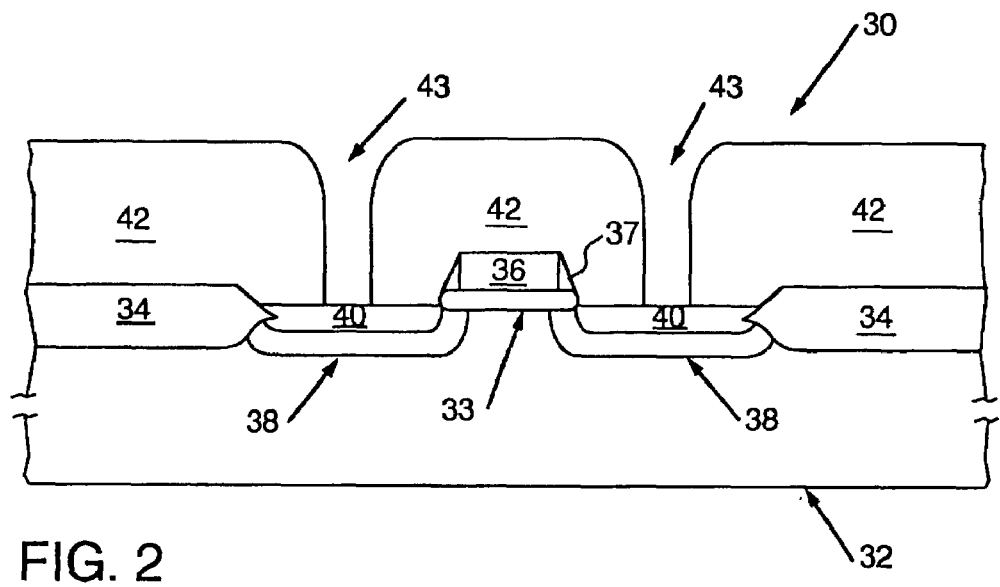
FIG. 2 is a cross-sectional view of a substrate-assembly on which a layer of photoresist has been deposited, masked, hardened, and etched.

FIG. 2 shows a cross-section of a substrate assembly 30 at an early stage in the fabrication process of the present invention. The substrate assembly 30 includes a substrate layer 32, which is the lowest layer of semiconductor material on a wafer, and additional layers or structures formed thereon. A LOCOS process is performed to provide a layer of gate-oxide 33 separated by field oxide regions 34. A polysilicon layer 36 is deposited and etched to provide a contact area, typically for the gate terminal of a transistor. A spacer 37 may be formed along the layer 36 using conventional techniques. Impurities are diffused into the substrate 34 through suitable masks to form diffusion areas 38. The diffusion areas 38 give rise to depletion regions that essentially isolate the source and drain terminals of the transistor from one another by two diodes. Silicide layers 40 are formed on the diffusion areas 38. The silicide layers 40 are formed by depositing a refractory metal such as titanium, platinum, palladium, cobalt, or tungsten on polysilicon. The metal/silicon alloy is then sintered to form the silicide layers 40.

After the silicide layers 40 are formed, the substrate assembly 30 is then ready for metallization. A layer of photoresist 42 is deposited on the substrate assembly 30 and is masked, hardened, and etched to define openings 43 for contact plugs. The photoresist layer 42 is hardened by baking the substrate assembly 30 at a temperature typically below 100° C.

Figure 3:
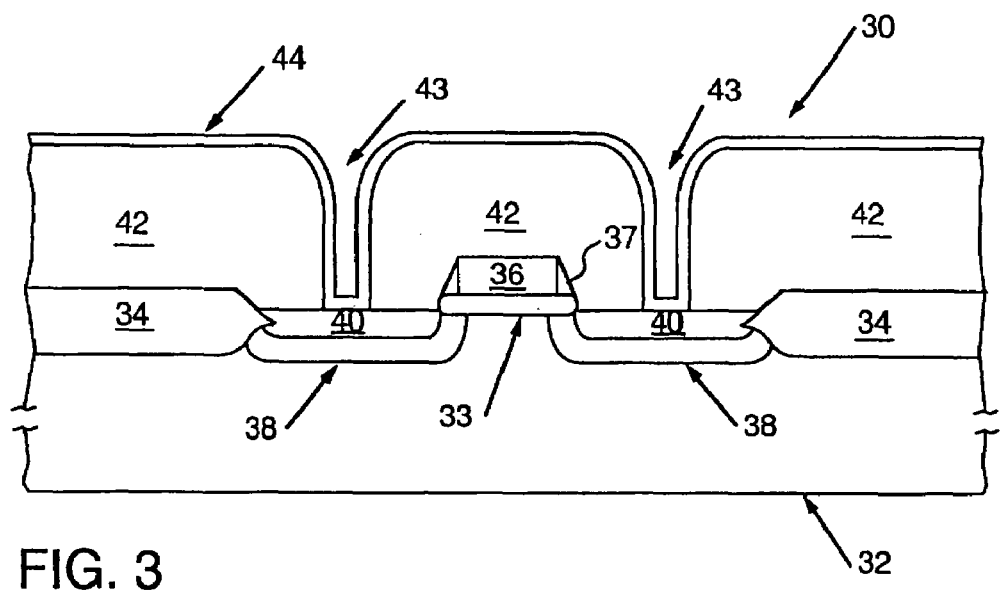
FIG. 3 is a cross-sectional view of the substrate assembly of FIG. 2 on which a promoter layer has been deposited on the etched photoresist layer.

FIG. 3 shows the substrate assembly 30 of FIG. 2 after a bilayer adhesion promoter layer 44 is deposited by, for example, sputtering onto the surface of the etched photoresist layer 42. Ionized sputtering is preferred to provide effective coverage of the sidewalls of deep openings. A chemical vapor deposition (CVD) process may also be used to deposit the bilayer adhesion promoter layer 44. The bilayer adhesion promoter layer 44 can be, among other substances, titanium/copper, chromium/copper, titanium nitride/copper, or tantalum/copper.

Figure 4:
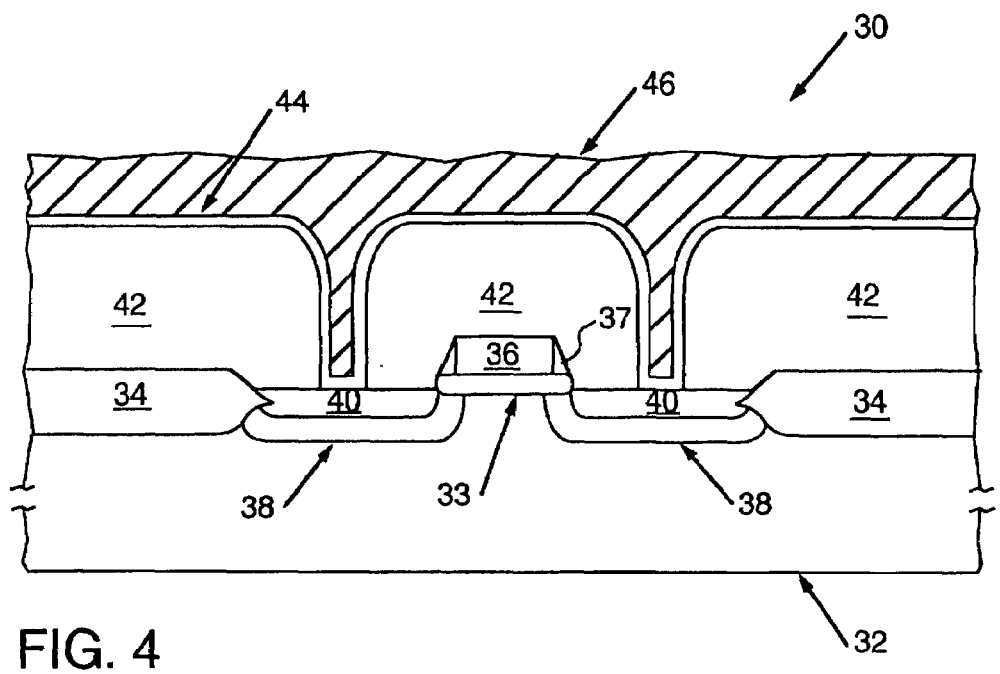
FIG. 4 is a cross-sectional view of the substrate assembly of FIG. 3 on which a metal layer has been deposited on the promoter layer.
Figure 5:
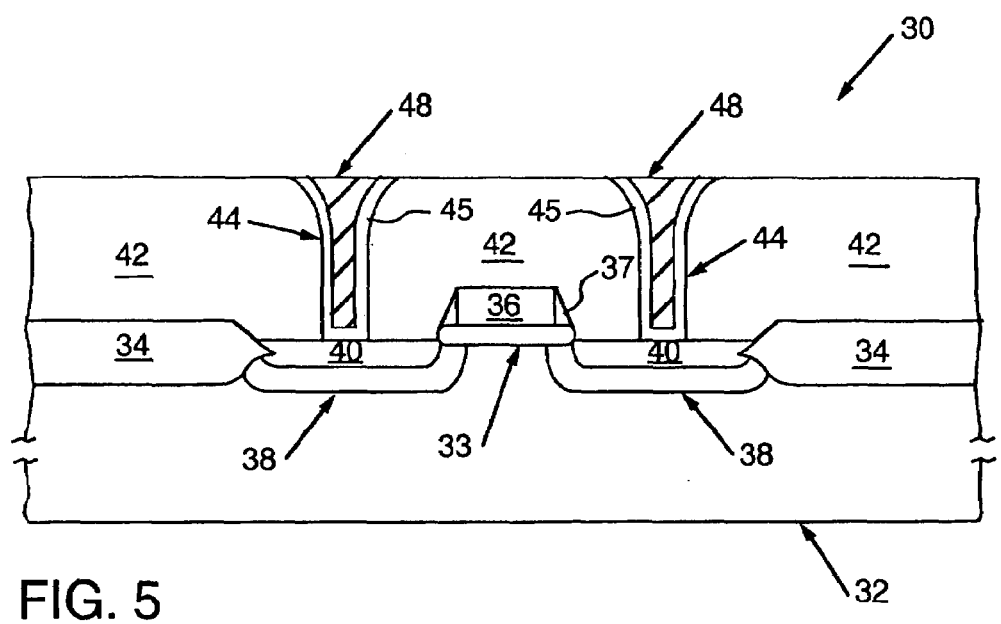
FIG. 5 is a cross-sectional view of the substrate assembly of FIG. 4 following removal of excess metal from the metal layer to form metal plugs.

As shown in FIG. 4, a metal layer 46 is formed by, for example, plating on the bilayer adhesion promoter layer 44. The metal layer 46 is preferably copper, which can be electroplated or electroless plated on the substrate assembly 30 at a process temperature around 30° C. The metal layer 46 may also be deposited using a CVD process. The excess metal from the metal layer 46 and the excess bilayer adhesion promoter layer 44 are removed through mechanical abrasion, for example, by chemical mechanical polishing, to form metal plugs 48, as shown in FIG. 5. The substrate assembly 30 is planar after the removal of the excess metal and the remaining portions of the bilayer adhesion promoter layer 44 define receptacles 45, in which the metal plugs 48 are located.

Figure 6:
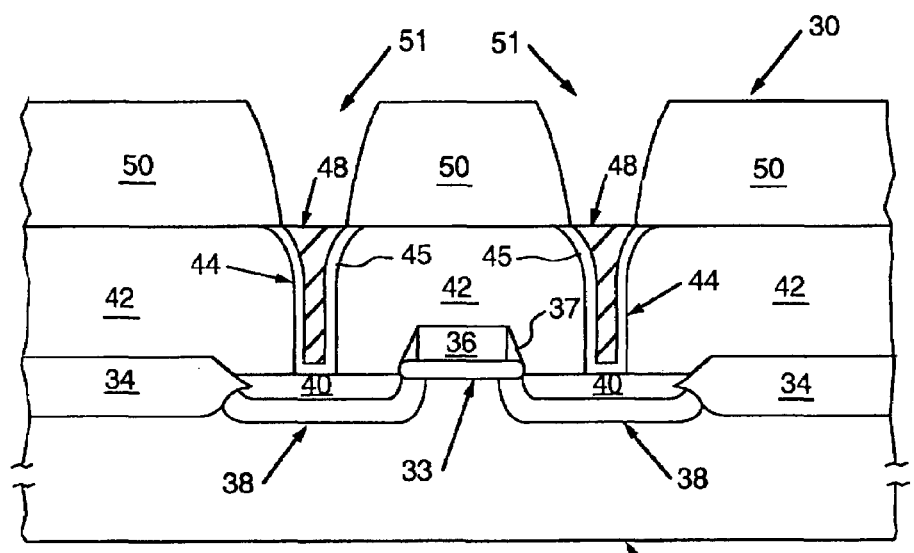
FIG. 6 is a cross-sectional view of the substrate assembly of FIG. 5 on which a photoresist layer has been deposited, masked, hardened, and etched on the promoter layer and metal plugs.
Figure 7:
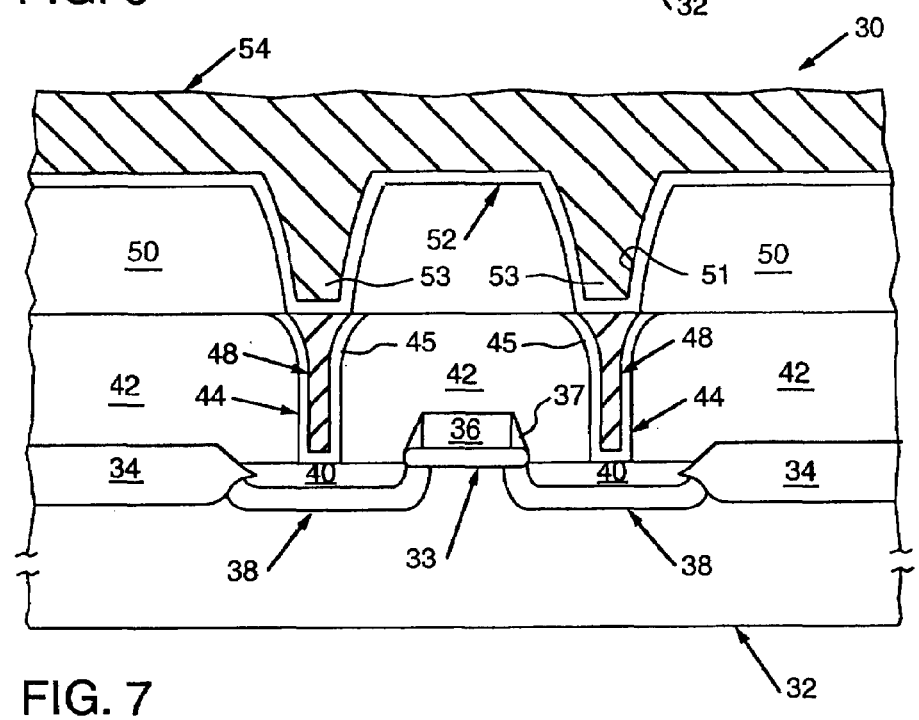
FIG. 7 is a cross-sectional view of the substrate assembly of FIG. 6 on which a promoter layer and a first metal layer have been deposited on the etched photoresist layer.
Figure 8:
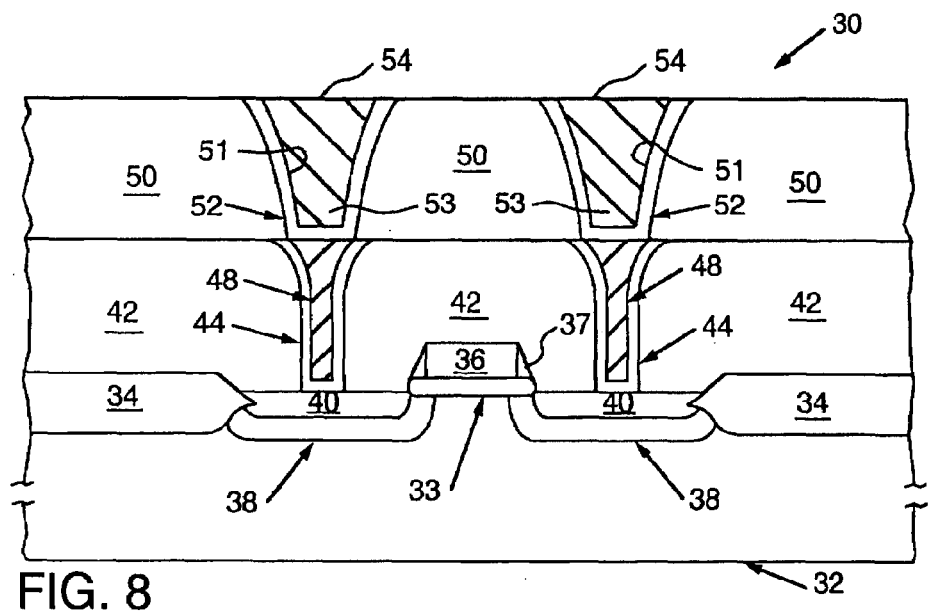
FIG. 8 is a cross-sectional view of the substrate assembly of FIG. 7 following the removal of excess metal from the first metal layer.

Another photoresist layer 50 is deposited onto the bilayer adhesion promoter layer 44 and the metal plugs 48 as shown in FIG. 6. The photoresist layer 50 is masked, hardened, and etched to define openings 51 for a metal layer which is aligned with the plugs 48. FIG. 7 shows a bilayer adhesion promoter layer 52 deposited on the etched photoresist layer 50 and the metal plugs 48 and a first metal layer 54 plated on the bilayer adhesion promoter layer 52. A portion of the metal fills the openings 51 forming contacts 53. Excess metal from the first metal layer 54 and excess bilayer adhesion promoter layer 52 are removed by mechanical abrasion, as shown in FIG. 8. Thus, the first metal layer 54 has contacts 53 and the resulting substrate assembly is planar.

Figure 9:
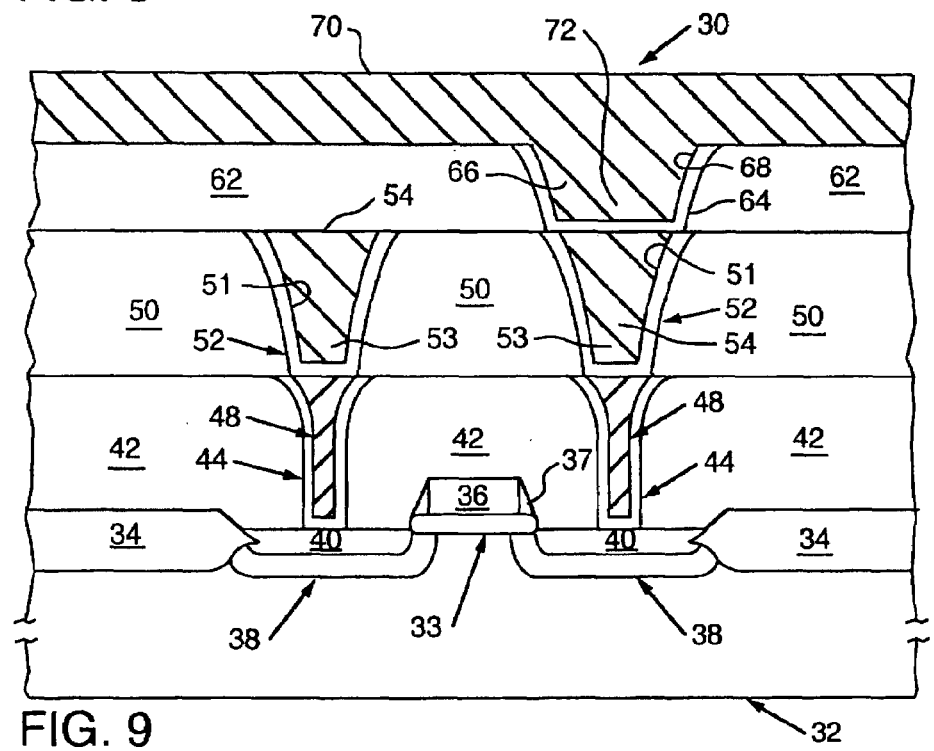
FIG. 9 is a cross sectional view of the substrate assembly of FIG. 8 following the addition of a photoresist layer, a bilayer adhesion promoter layer, a metal plug, and a second metal layer onto the etched photoresist layer and the first metal layer.

FIG. 9 illustrates the substrate assembly 30 of FIG. 8 after photoresist layer 62 is deposited, hardened and etched, bilayer adhesion promoter layer 64 is deposited, and a metal layer is deposited onto the substrate assembly 30. The substrate assembly 30 in FIG. 9 has been mechanically polished to remove the excess metal and the remaining portions of the bilayer adhesion promoter layer 64 to form metal plug 66 in receptacle 68. A second metal layer 70 has been deposited on the substrate assembly 30 to form contact 72. Multiple layers of metal can be built up by adding layers of bilayer adhesion promoter, photoresist, and metal.

Figure 10:
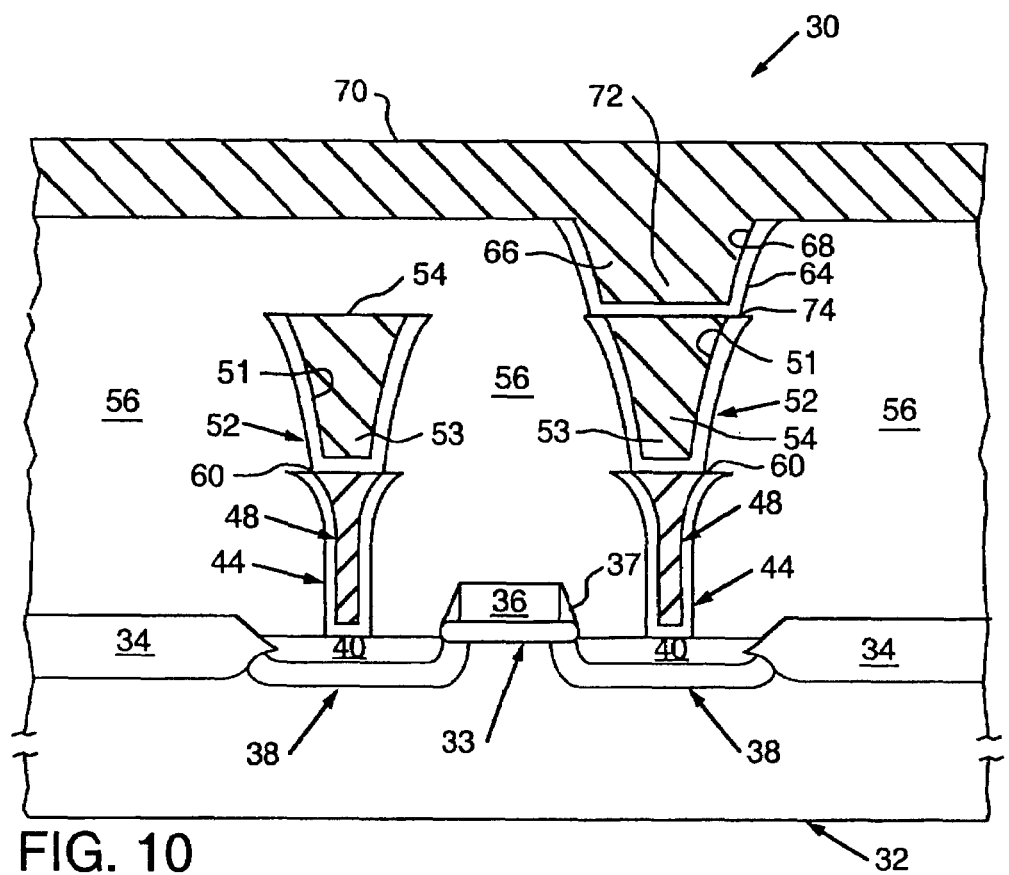
FIG. 10 is a cross-sectional view of the substrate assembly of FIG. 9 following the removal of the photoresist layers to form gaps between the promoter layers and the underlying substrate assembly.

FIG. 10 shows a resulting substrate assembly 30 of FIG. 9 with the first metal layer 54 and the second metal layer 70 formed. The photoresist layers 42, 50 and 62 are removed by, for example, ashing in oxygen plasma to form air gaps 56. The metal layers 54 and 70 are supported by columns 60 and 74 formed by the combination of the metal plugs 48 and 66 and the contacts 53 and 72. The air gaps 56 have a dielectric constant of 1, thereby reducing the capacitance of the resulting structure. By selecting appropriate metal conductors which have a low resistance, the RC time constant of the resulting structure is reduced.

The present invention also contemplates a method by which the above-described semiconductor interconnect structure is fabricated using typical fabrication steps, materials, and machines. The method, in its broadest form, is comprised of the steps of depositing a layer of photoresist on a substrate assembly. The photoresist is etched to form openings. A metal layer is formed on the photoresist layer so as to fill the openings formed in the photoresist layer. Thereafter, the photoresist layer is removed by, for example, ashing. The metal layer is thus supported by the metal which filled the openings formed in the photoresist.

The method of the present invention may be modified by, for example, depositing a promoter layer prior to forming the metal layer. Conventional techniques may be used for the "depositing" and "forming" steps such as sputtering and electroplating. A wide variety of metals and promoters may be used in the process.

Figure 11:
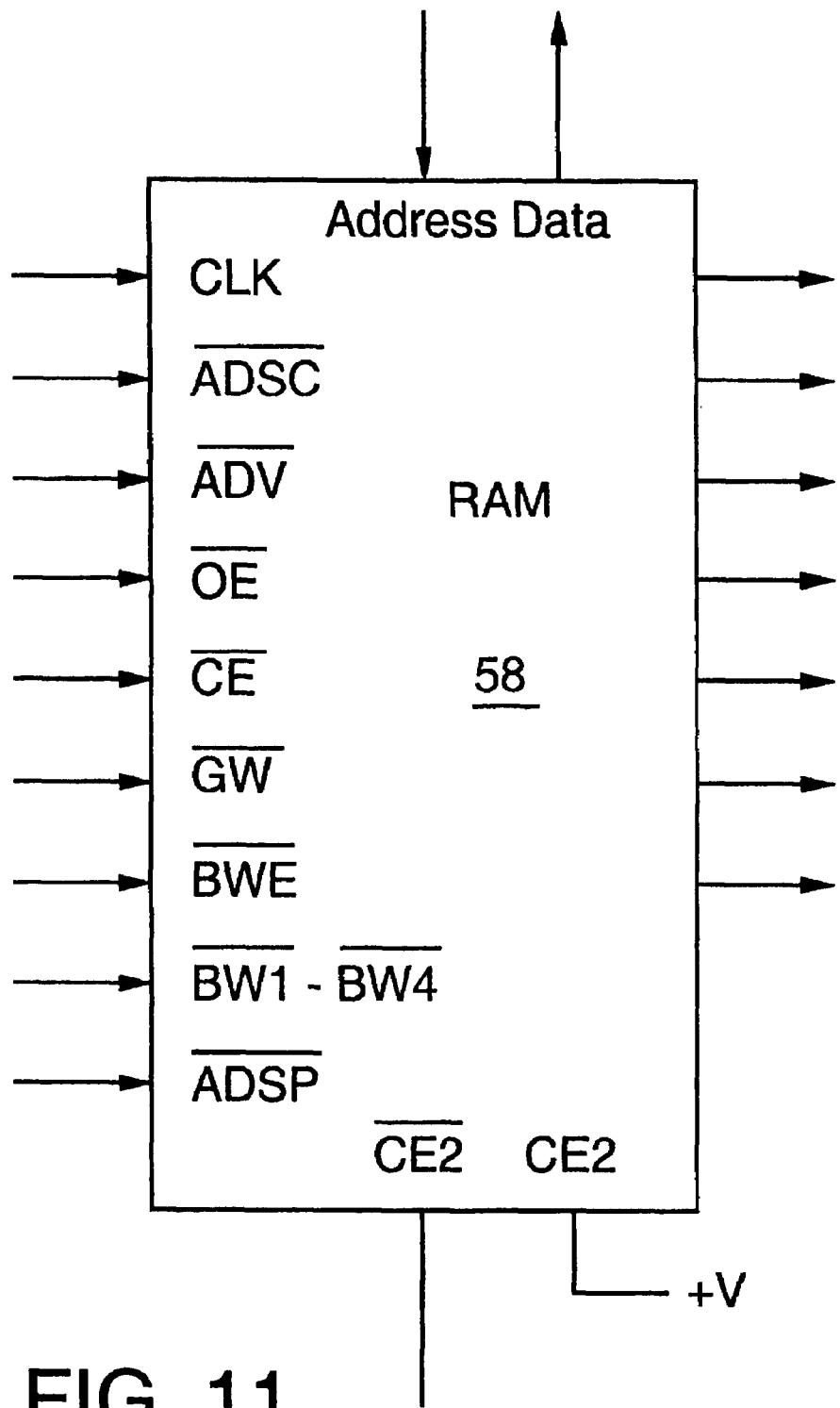
FIG. 11 illustrates a semiconductor device in which the present invention may be used.

FIG. 11 illustrates a semiconductor device 58 in which the present invention may be employed. The semiconductor device 58 may be any type of solid state device, such as a memory device.

While the present invention has been described in conjunction with preferred embodiments thereof, many modifications and variations will be apparent to those of ordinary skill in the art. The foregoing description and the following claims are intended to cover all such modifications and variations.

What is claimed is:

1. A method of fabricating a semiconductor interconnect structure, the method comprising:
   forming a first metal plug in contact with a silicide layer of a substrate assembly and in a first opening defined by a first layer of photoresist, wherein the silicide layer comprises at least one of the group consisting of a platinum silicide, a palladium silicide, a cobalt silicide and a tungsten silicide, and wherein the first metal plug is formed to include a planar top surface having a first cross-sectional area;
   forming a first metal layer in contact with the first metal plug and in a second opening defined by a second layer of photoresist;
   forming a second metal plug in contact with the first metal layer and in a third opening defined by a third layer of photoresist, wherein the second metal plug is formed to include a planar top surface having a cross-sectional area that is greater than the first cross-sectional area;
   forming a second metal layer in contact with the second metal plug and on the third layer of photoresist; and
   removing the first, second and third layers of photoresist.

2. The method of claim 1, wherein forming the first metal plug includes:
   depositing a metal in the first opening and on a first surface of the first layer of photoresist; and
   removing the metal deposited on the first surface of the first layer of photoresist.

3. The method of claim 2, wherein depositing the metal includes depositing the metal by one of electroplating, electroless plating and chemical vapor deposition.

4. The method of claim 2, wherein depositing the metal includes depositing copper.

5. The method of claim 2, wherein removing the metal deposited on the first layer of photoresist includes removing the metal by mechanical abrasion.

6. The method of claim 5, wherein removing the metal by mechanical abrasion includes removing the metal by chemical mechanical polishing.

7. The method of claim 1, wherein forming the first metal plug includes:
   depositing a promoter layer in the first opening and on a first surface of the first layer of photoresist;
   depositing a metal in the first opening and on a first surface of the promoter layer;
   removing the metal deposited on the first surface of the promoter layer; and
   removing the promoter layer deposited on the first surface of the first layer of photoresist.

8. The method of claim 7, wherein depositing the promoter layer includes depositing the promoter layer by one of sputtering and chemical vapor deposition.

9. The method of claim 7, wherein depositing the promoter layer includes depositing a bilayer adhesion promoter layer.

10. The method of claim 9, wherein depositing the bilayer adhesion promoter layer includes:
    depositing an adhesion layer of one of titanium, chromium, titanium nitride and tantalum; and
    depositing a promoter layer of copper.

11. The method of claim 7, wherein removing the promoter layer deposited on the first surface of the first layer of photoresist includes removing the promoter layer by mechanical abrasion.

12. The method of claim 11, wherein removing the promoter layer by mechanical abrasion includes removing the promoter layer by chemical mechanical polishing.

13. The method of claim 1, wherein forming the first metal layer includes:
depositing a metal in the second opening and on a first surface of the second layer of photoresist; and
removing the metal deposited on the first surface of the second layer of photoresist.

14. The method of claim 13, wherein depositing the metal includes depositing the metal by one of electroplating, electroless plating and chemical vapor deposition.

15. The method of claim 13, wherein depositing the metal includes depositing copper.

16. The method of claim 13, wherein removing the metal deposited on the first surface of the second layer of photoresist includes removing the metal by mechanical abrasion.

17. The method of claim 16, wherein removing the metal by mechanical abrasion includes removing the metal by chemical mechanical polishing.

18. The method of claim 1, wherein forming the first metal layer includes:
depositing a promoter layer in the second opening and on a first surface of the second layer of photoresist;
depositing a metal in the second opening and on a first surface of the promoter layer;
removing the metal deposited on the first surface of the promoter layer; and
removing the promoter layer deposited on the first surface of the second layer of photoresist.

19. The method of claim 18, wherein depositing the promoter layer includes depositing the promoter layer by one of sputtering and chemical vapor deposition.

20. The method of claim 18, wherein depositing the promoter layer includes depositing a bilayer adhesion promoter layer.

21. The method of claim 20, wherein depositing the bilayer adhesion promoter layer includes:
depositing an adhesion layer of one of titanium, chromium, titanium nitride and tantalum; and
depositing a promoter layer of copper.

22. The method of claim 18, wherein removing the promoter layer deposited on the first surface of the second layer of photoresist includes removing the promoter layer by mechanical abrasion.

23. The method of claim 22, wherein removing the promoter layer by mechanical abrasion includes removing the promoter layer by chemical mechanical polishing.

24. The method of claim 1, wherein forming the second metal plug includes:
depositing a metal in the third opening and on a first surface of the third layer of photoresist; and
removing the metal deposited on the first surface of the third layer of photoresist.

25. The method of claim 24, wherein depositing the metal includes depositing the metal by one of electroplating, electroless plating and chemical vapor deposition.

26. The method of claim 24, wherein depositing the metal includes depositing copper.

27. The method of claim 24, wherein removing the metal deposited on the first surface of the third layer of photoresist includes removing the metal by mechanical abrasion.

28. The method of claim 27, wherein removing the metal by mechanical abrasion includes removing the metal by chemical mechanical polishing.

29. The method of claim 1, wherein forming the second metal plug includes: removing the promoter layer deposited on the first surface of the third layer of photoresist.

30. The method of claim 29, wherein depositing the promoter layer includes depositing the promoter layer by one of sputtering and chemical vapor deposition.

31. The method of claim 29, wherein depositing the promoter layer includes depositing a bilayer adhesion promoter layer.

32. The method of claim 31, wherein depositing the bilayer adhesion promoter layer includes:
depositing an adhesion layer of one of titanium, chromium, titanium nitride and tantalum; and
depositing a promoter layer of copper.

33. The method of claim 29, wherein removing the promoter layer deposited on the first surface of the third layer of photoresist includes removing the promoter layer by mechanical abrasion.

34. The method of claim 33, wherein removing the promoter layer by mechanical abrasion includes removing the promoter layer by chemical mechanical polishing.

35. The method of claim 1, wherein forming the second metal layer includes forming a layer of copper.

36. The method of claim 1, wherein removing the first, second and third layers of photoresist includes ashing the first, second and third layers of photoresist.

37. The method of claim 36, wherein ashing the first, second and third layers of photoresist includes ashing the first, second and third layers of photoresist in a plasma.

38. The method of claim 37, wherein ashing the first, second and third layers of photoresist in a plasma included ashing the first, second and third layers of photoresist in an oxygen plasma.

* * * * *

UNITED STATES PATENT AND TRADEMARK OFFICE
CERTIFICATE OF CORRECTION

| | | |
|---|---|---|
| PATENT NO. | : 7,271,085 B2 | Page 1 of 1 |
| APPLICATION NO. | : 10/641540 | |
| DATED | : August 15, 2007 | |
| INVENTOR(S) | : Kie Y. Ahn | |

It is certified that error appears in the above-identified patent and that said Letters Patent is hereby corrected as shown below:

Col. 8, lines 18-20, should read,

The method of claim 1, wherein forming the second metal plug includes:

depositing a promoter layer in the third opening and on a first surface of the third layer of photoresist;

depositing a metal in the third opening and on a first surface of the promoter layer;

removing the metal deposited on the first surface of the promoter layer; and removing the deposited on the first surface of the third layer of photoresist.

Signed and Sealed this

Eleventh Day of December, 2007

JON W. DUDAS
*Director of the United States Patent and Trademark Office*

UNITED STATES PATENT AND TRADEMARK OFFICE
CERTIFICATE OF CORRECTION

PATENT NO. : 7,271,085 B2  
APPLICATION NO. : 10/641540  
DATED : September 18, 2007  
INVENTOR(S) : Kie Y. Ahn Page 1 of 1

It is certified that error appears in the above-identified patent and that said Letters Patent is hereby corrected as shown below:

Col. 8, lines 18-20, should read,

The method of claim 1, wherein forming the second metal plug includes:

depositing a promoter layer in the third opening and on a first surface of the third layer of photoresist;

depositing a metal in the third opening and on a first surface of the promoter layer;

removing the metal deposited on the first surface of the promoter layer; and removing the deposited on the first surface of the third layer of photoresist.

This certificate supersedes the Certificate of Correction issued December 11, 2007.

Signed and Sealed this

First Day of January, 2008

JON W. DUDAS  
*Director of the United States Patent and Trademark Office*